Nov. 6, 1951 E. TOTH 2,573,742
OSCILLATOR FREQUENCY CONTROL
Filed Dec. 31, 1940
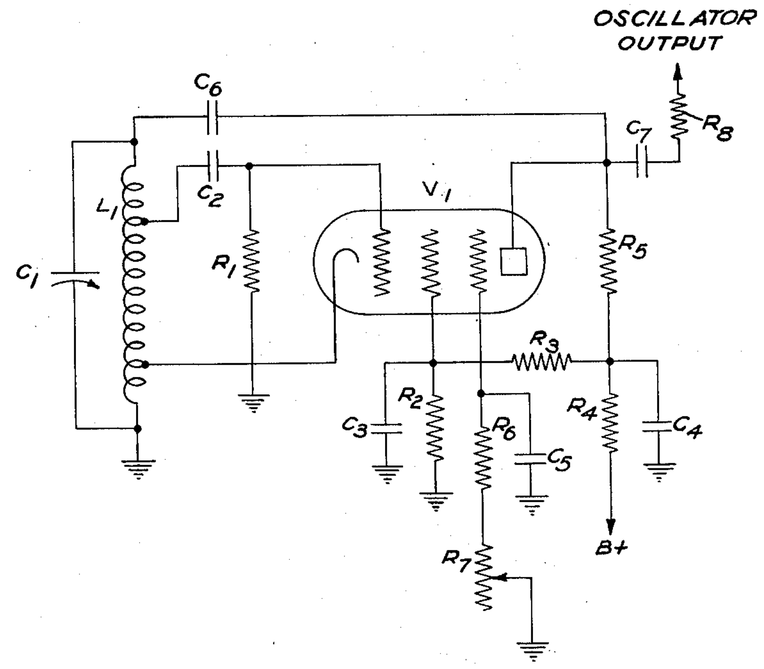
INVENTOR
Emerick Toth
BY W Glen Jones
ATTORNEY

Patented Nov. 6, 1951 2,573,742

UNITED STATES PATENT OFFICE 2,573,742

OSCILLATOR FREQUENCY CONTROL

Emerick Toth, Cheverly, Md.

Application December 31, 1940, Serial No. 372,610

7 Claims. (Cl. 250—36)

(Granted under the act of March 3, 1883, as amended April 30, 1928; 370 O. G. 757)

This invention relates to a means for controlling the frequency of an oscillator from a distance.

It is an object of this invention to provide means whereby the frequency of an oscillator may be controlled from a distance without the necessity of extension shafts or long leads carrying radio frequency currents.

It is a further object of this invention to provide a means for controlling the frequency of an oscillator at a distance by means of a control circuit carrying direct current only.

The single figure of the drawing is a diagram showing the circuit involved in this invention.

In the drawing $V_1$ represents a radio frequency pentode tube (having a suppressor grid), which is used as an electron-coupled oscillator tube. For this purpose a tube of the type 6K7 or similar types may be used. The plate of this tube is coupled through condenser $C_6$ to the ungrounded or high end of tuned grid circuit $L_1C_1$. The control grid is tapped down on coil $L_1$ through a grid connection containing grid leak $R_1$ and condenser $C_2$. The screen is fed with a direct current voltage stabilizing network comprising $R_2$, $R_3$ and $R_4$ and bypass condensers $C_3$ and $C_4$. The plate is connected to the B supply through load resistor $R_5$ and is provided with an output circuit containing condenser $C_7$ and isolating resistor $R_8$.

The frequency of an oscillator of this type is normally very stable, due to the use of an electron-coupled oscillator circuit with a voltage stabilizing network feeding the screen and plate, and the tapping down of the control grid on coil $L_1$. The frequency of such an oscillator is usually changed by varying $L_1$ or $C_1$. This, however, involves either the use of extension shafts, or long leads carrying radio frequency currents, where control of frequency at a distance from the oscillator is required.

The system of control embodied in this invention requires only two wires, or one lead and a ground, carrying direct current only and involving no radio frequency leads. Thus the oscillator frequency may be controlled in locations and at a distance greater than practicable by other methods. Resistor $R_6$ and condenser $C_5$ constitute a control system which isolates the suppressor grid circuit of $V_1$ from control resistor $R_7$, as far as radio frequency currents are concerned. $R_7$ may thus be located at a substantial distance from $V_1$, since the resistor usually carries only a few micro-amperes of D. C. Variation of resistor $R_7$ will control the frequency of the oscillator, within limits determined primarily by the values of $C_6$ and $R_7$ and the L-C ratio of the tuned circuit $L_1C_1$.

For example, one such oscillator used as an audio heterodyne or A. F. beat oscillator in a receiver was controlled from $-500$ to $+500$ cycles with a center frequency of 175 kc. This was an exceptionally stable oscillator, with an L-C ratio of 1000 micro-henries to 850 mmf. and the following constants: $R_1=50{,}000$ ohms, $R_2=100{,}000$ ohms, $R_3=10{,}000$ ohms, $R_4=5{,}000$ ohms, $R_5=100{,}000$ ohms, $R_6=10{,}000$ ohms, $R_7=1{,}000{,}000$ ohms, $R_8=250{,}000$ ohms, $C_2=250$ mmf., $C_3=C_4=C_5=0.1$ mf., $C_6=100$ mmf., $C_7=25$ mmf., $V_1=$ 6K7G, ($L_1=1000$ $\mu$h., $C_1=850$ mmf.). The grid of the oscillator was tapped down at about ⅓ of the $L_1$ inductance and the cathode at about $\frac{1}{10}$ of $L_1$. Substantially linear control of frequency was obtained by using an approximately logarithmic taper for variable resistor $R_7$. The measured drift of this oscillator was found to be between 1 and 2 cycles per degree C. change in temperature, and was apparently unaffected by the value of $R_7$.

The method of functioning of this circuit is believed to be as follows:

The suppressor-grid-to-plate resistance of tube $V_1$, with resistor $R_7$ shorted out, is low, perhaps on the order of 10,000 or 20,000 ohms. Condenser $C_6$, which is connected to the high potential end of condenser $C_1$, is thus shunted across $C_1$ to ground, through the suppressor grid to plate resistance of $V_1$ in series with condenser $C_5$ ($C_5$ being low in impedance as compared to $R_6$ and $R_7$). Additionally, other shunt circuits exist from the plate to ground ($R_5$, $C_4$; $C_7$, $R_8$) but these are normally higher in impedance than the circuit through the suppressor grid of the tube in series with $C_5$, and may be disregarded for the purposes of this discussion.

The internal suppressor-grid-to-plate resistance of $V_1$ may be changed by biasing the suppressor grid with an appropriate voltage from an external source. A similar change can be made in this resistance by self-biasing the suppressor-grid with its own current (largely derived by secondary emission from the plate) through a resistor. If this should be a variable resistor, such as $R_7$, then the suppressor-grid-to-plate resistance of $V_1$ could be raised over a range determined to a considerable extent by the range of variation of $R_7$. Thus variation of $R_7$ could be made to control the alternating current or radio frequency resistance in series with $C_6$ to ground, with only direct current passing through control $R_7$.

The equivalent parallel capacity of the series combination of $C_6$ and the suppressor-grid-to-plate resistance of $V_1$ depends on the value of the resistance. This equivalent parallel capacity can thus be controlled by variation of $R_7$ over a considerable range, and will cause changes in oscillator frequency due to its shunting effect on main tuning capacity $C_1$.

It should be understood that the practice of the invention is not limited to the embodiments illustrated and described but only by the scope and limitations of the appended claims.

The invention described herein may be manufactured and/or used by or for the Government of the United States of America for governmental purposes without the payment of any royalties thereon or therefor.

I claim:

1. Means for controlling the frequency of an oscillator including an electron discharge device having a cathode, an anode and three electrodes therebetween, and a tuned circuit coupled to the cathode and the two electrodes nearest thereto in such a manner as to sustain oscillations, comprising a reactive connection between said anode and said tuned circuit, and a connection from the remaining electrode to the tuned circuit at a point thereon displaced from the reactive connection thereto, the last-named connection including a variable resistor and by-passing condenser means therefor.

2. In an electron coupled oscillator comprising an electron discharge device having an anode, a cathode, a control grid and a screen grid, and a tuned circuit coupled to said cathode, control grid and screen grid in such a manner as to sustain oscillations, means for controlling from a distance the frequency of said oscillations, said means comprising an electrode included in said device intermediate said screen grid and said anode, a reactive connection between said anode and said tuned circuit, and a connection from said electrode to said tuned circuit at a point thereon displaced from the reactive connection thereto, the last-named connection including a variable resistor and by-passing condenser means therefor.

3. An electron coupled oscillator comprising an electron discharge device having an anode, a cathode, a control grid, a screen grid and a suppressor grid, a tuned circuit coupled to said cathode, control grid and screen grid in such a manner as to sustain oscillations, and means for controlling the frequency of said oscillations, said means including a reactive connection between said anode and said tuned circuit, a connection from suppressor grid to said tuned circuit at a point thereon displaced from the reactive connection thereto, and means applying a variable bias on said suppressor grid for varying the effective resistance within said device between said anode and said suppressor grid.

4. In combination, an oscillator including an electron discharge device having a cathode, an anode, and at least three electrodes therebetween, a tuned circuit coupled to said cathode and the two electrodes nearest thereto in such a manner as to sustain oscillations, a condenser connected between said anode and said tuned circuit, and a connection from the remaining electrode to a point on said tuned circuit spaced from the connection of said condenser thereto, the last-named connection including a variable resistance means and by-pass condenser means therefor.

5. An oscillator comprising an electron discharge device having an anode, a cathode, a control grid, a screen grid and a suppressor grid, a tuned circuit coupled to said cathode, said control grid and said screen grid in such a manner as to sustain oscillations, and means for varying the frequency of said oscillations, said means comprising reactance means and means variably connecting said reactance means in shunt with said tuned circuit, the last-named means comprising means connecting said reactance means between said anode and one side of said tuned circuit, means connecting said suppressor grid to another side of said tuned circuit opposite said one side thereof, and means controlling the bias on said suppressor grid for varying the suppressor grid-anode resistance of said device.

6. An electron coupled oscillator comprising an electron discharge device having an anode, a cathode, and at least three electrodes therebetween, a parallel tuned circuit, means for connecting the two electrodes nearest said cathode to spaced points on said tuned circuit and for connecting said cathode to an intermediate point thereon so that oscillations are sustained, means for controlling from a distance the frequency of said oscillations, said control means comprising a reactive connection from said anode to a point on said tuned circuit displaced in one direction from the point said cathode is connected thereto and means connecting the remaining electrode to a point on said tuned circuit displaced in a direction opposite said one direction from the point said cathode is connected thereto, the last-named means including a variable resistor and by-passing condenser means therefor.

7. Means for controlling the frequency of an oscillator including an electron discharge device having a cathode, an anode and three electrodes therebetween, and a tuned circuit coupled to the cathode and the two electrodes nearest thereto in such a manner as to sustain oscillations, comprising a reactive connection between said anode and said tuned circuit, a connection from the remaining electrode to the tuned circuit at a point thereon displaced from the reactive connection thereto, and means applying a variable bias on said remaining electrode.

EMERICK TOTH.

REFERENCES CITED

The following references are of record in the file of this patent:

UNITED STATES PATENTS

| Number | Name | Date |
|---|---|---|
| Re. 20,293 | Dow | Mar. 16, 1937 |
| 2,051,936 | Braaten | Aug. 25, 1936 |
| 2,066,027 | Braaten | Dec. 29, 1936 |
| 2,124,189 | Dow | July 19, 1938 |

FOREIGN PATENTS

| Number | Country | Date |
|---|---|---|
| 380,144 | Great Britain | Sept. 15, 1932 |